United States Patent [19]

Unno et al.

[11] Patent Number: 5,491,350
[45] Date of Patent: Feb. 13, 1996

[54] LIGHT EMITTING DIODE AND PROCESS FOR FABRICATING THE SAME

[75] Inventors: Tsunehiro Unno; Taichiro Konno, both of Ibaraki, Japan

[73] Assignee: Hitachi Cable Ltd., Tokyo, Japan

[21] Appl. No.: 268,644

[22] Filed: Jun. 30, 1994

[30] Foreign Application Priority Data

Jun. 30, 1993 [JP] Japan .................................... 5-160610
Nov. 17, 1993 [JP] Japan .................................... 5-287987

[51] Int. Cl.$^6$ ......................... H01L 33/00; H01L 27/15; H01L 31/12
[52] U.S. Cl. ................. 257/99; 257/95; 257/81
[58] Field of Search .................................... 257/99, 95, 81

[56] References Cited

U.S. PATENT DOCUMENTS 5,073,806  12/1991  Idei .

FOREIGN PATENT DOCUMENTS 55-162284  12/1980  Japan ........................................ 257/95

OTHER PUBLICATIONS

Chang et al, "Source Shaping in the Fabrication of Light–Emitting Diodes..." IBM Tech Discl Bul, vol 15 No. 1, 1972, pp. 180–181.

Primary Examiner—Stephen D. Meier
Attorney, Agent, or Firm—Helfgott & Karas

[57] ABSTRACT

Disclosed is a light emitting diode in which double heterostructure epitaxial layers defining a light emitting portion are connected with a substrate by a mesa portion, and a cavity layer is formed by providing a mesa portion between the substrate and an adjoining layer of the epitaxial layers. Resin may be put into the cavity layer. Also provided is a process for fabricating a light emitting diode wherein the process comprises the steps of growing an AlGaAs layer with high mixed crystal ratio as a sacrificial layer, growing the epitaxial layers on the sacrificial layer to be connected with the mesa portion, and dissolving and removing the sacrificial layer to form the cavity layer. Light is reflected at the interface between a clad layer and the cavity layer or the resin put into the cavity layer, as a consequence, a light-emitting output can be improved. A thick AlGaAs layer with high AlAs mixed crystal ratio for the substrate is not required to be provided, so that the fabrication becomes easy, and uniformity in characteristics can be obtained.

12 Claims, 4 Drawing Sheets

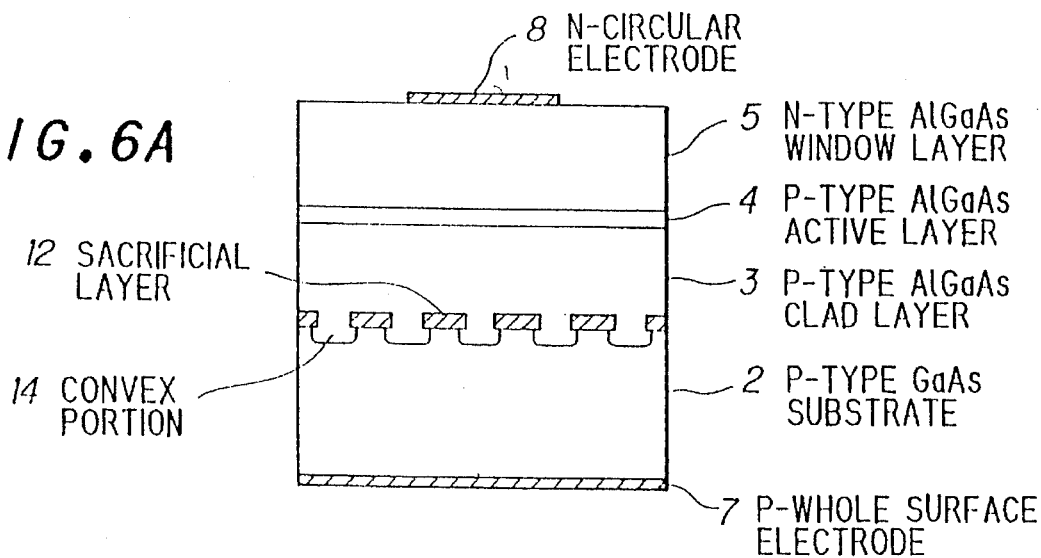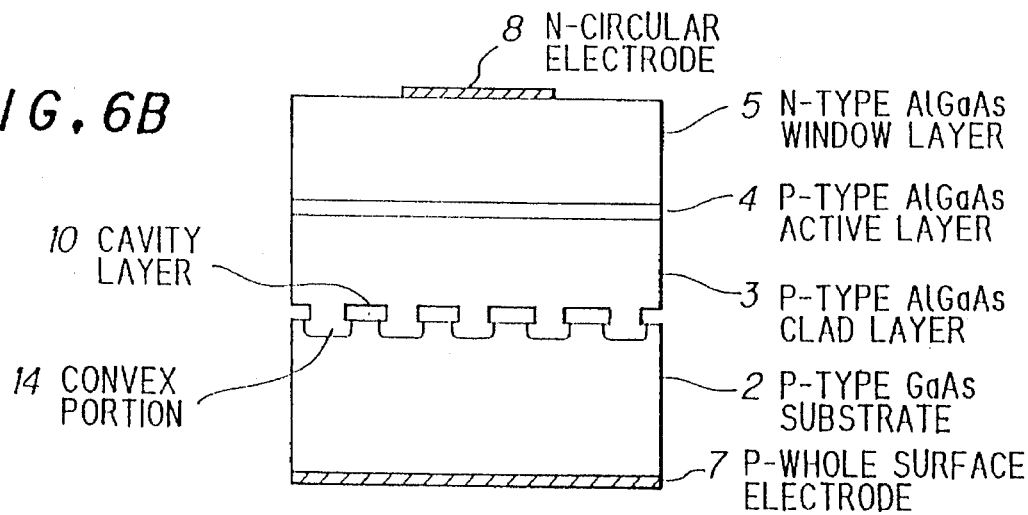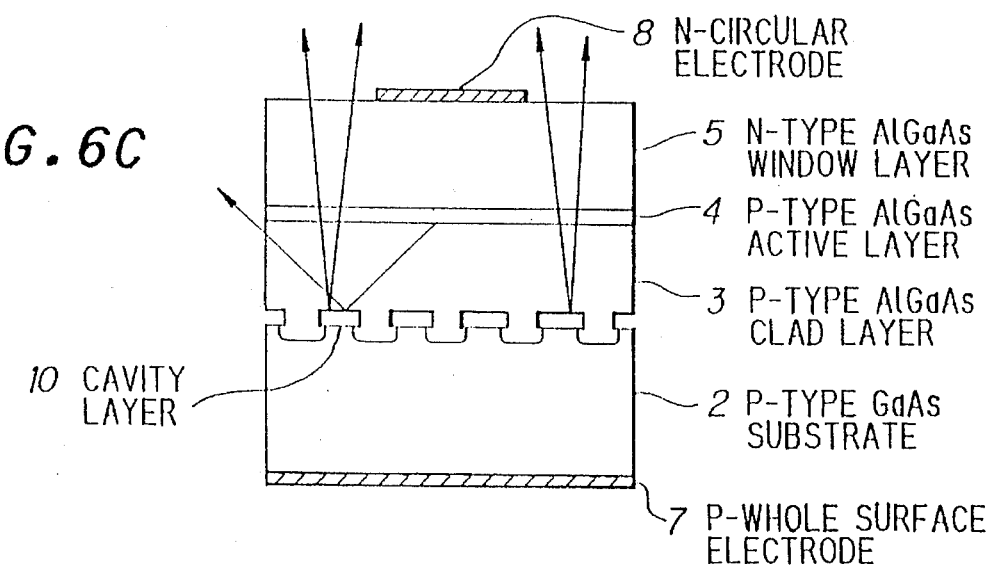

LIGHT EMITTING DIODE AND PROCESS FOR FABRICATING THE SAME

BACKGROUND OF THE INVENTION

The present invention relates to a light emitting diode which has high emission output and a process for fabricating the same.

In general, in order to increase emission output of a light emitting diode, there is a method of enhancing internal quantum efficiency which is efficiency to convert electricity to light or a method of enhancing light output efficiency which is efficiency to take out light from the light emitting diode.

As means for enhancing internal quantum efficiency, single hetero structure and double hetero structure have been already utilized. According to these structures, internal quantum efficiency is significantly improved to reach a high output.

On the other hand, though the light output efficiency is a major factor to determine the emission value of the light emitting diode, to obtain high efficiency in the light output is difficult since light is reflected on the surface of the chip due to the difference between the refraction index of the light output surface of the chip of the light emitting diode and that of the external(air).

Therefore, a light emitting diode in which light going to the back surface is reflected on the back surface and is taken out from the front surface is suggested. The light emitting diode is obtained by growing an AlGaAs thick film on a GaAs substrate, growing an AlGaAs layer as a light emitting portion thereon, and the removing GaAs substrate.

In order to effectively reflect the light on the back surface, it is needed to prevent the light from being absorbed into an epitaxial layer or the substrate. This idea is well known in the light emitting diode of GaP, InP and the mixed crystal thereof. In a GaAs substrate, it is needed to use an AlGaAs substrate which has AlAs mixed crystal of relatively high ratio since light is absorbed into the GaAs substrate. Therefore, as described above, the AlGaAs layer of thick film is grown to be used in place of a single element substrate and the substrate originally used is removed.

As mentioned above, in order to make an AlGaAs epitaxial wafer which has a structure in which light is reflected on the back surface of the chip of the light emitting diode, the AlGaAs substrate is needed. It is obtained by growing an AlGaAs thick film on the GaAs substrate, growing an AlGaAs layer as a light emitting portion thereon, and removing the GaAs substrate. The AlGaAs thick film is in general required to be around 50 micrometers thick so as to hold the shape of the wafer for the chip of the light emitting diode.

However, when an AlGaAs layer having high ratio of mixed crystal is epitaxially grown by the gradually cooling method, it is difficult to grow an AlGaAs epitaxial layer which is thick and high in ratio of AlAs mixed crystal since the amount of Al solved is large whereas that of GaAs solved is small when GaAs and Al are added to a solvent of Ga. Because of this, it is necessary to take means or method of increasing the growth starting temperature to around 1000° C. (though normally approximately 900° C.), thickening the thickness of a solution reservoir, and slowing down the cooling rate or the like. In these methods, however, the amount of raw material is increased, the growth takes a long time and the cost for manufacturing it goes up. Besides, the film thickness within the surface is dispersed to the extent of 50 to 100 micrometers, it is difficult to improve the uniformity in the film thickness and the properties, and the wafer becomes brittle or to the internal distortion caused by the dispersion in the film thickness.

There is the temperature difference method in addition to the gradually cooling method, but in this method the number of the epitaxial wafer which can be grown in one step is very few, i.e., around one or two. Therefore, when the epitaxial wafer is mass-produced, a number of growth devices are needed and the yield becomes low due to the dispersion of the properties, and the cost for manufacturing it goes up. Based upon the above reasons, a light emitting diode reflecting the light without the AlGaAs thick film to improve the efficiency has been desired.

SUMMARY OF THE INVENTION

In consideration of the above problems, it is an object of the first invention to provide a light emitting diode which gives high light emitting output and can be fabricated easily and a process for fabricating the same.

It is an object of the second invention to provide a light emitting diode which improves the yield in fabrication and the reliability while maintaining the properties of high light emitting output.

According to the first feature of the invention, a light emitting diode which is formed with a plurality of epitaxial layers which form a light emitting portion on a substrate comprises: a convex mesa portion on the surface of the substrate, wherein the epitaxial layers are partially connected with the convex mesa portion, and a cavity layer is formed between the substrate and the epitaxial layers except for the mesa portion.

According to the second feature of the invention, a light emitting diode which is formed with a plurality of epitaxial layers which form a light emitting portion on a substrate comprises: a convex portion on the back surface of the epitaxial layers, wherein the epitaxial layers are partially connected with the convex portion, and a cavity layer is formed between the substrate and the epitaxial layers except for the convex portion.

According to the third feature of the invention, a light emitting diode which is formed with a plurality of epitaxial layers which form a light emitting portion on a substrate comprises: a convex mesa portion on the surface of the substrate; a convex portion on the back surface of the epitaxial layers, wherein the epitaxial layers are partially connected with the substrate by the mesa portion and convex portion, and a cavity layer is formed between the substrate and the epitaxial layers except for the mesa portion and the convex portion.

According to the fourth feature of the invention, in the light emitting diode according to any of the first to third features of the invention, the substrate is GaAs, and the epitaxial layers are GaAlAs to provide higher brightness.

According to the fifth feature of the invention, in the light emitting diode according to any of the first to fourth features of the invention, resin is put into the cavity layer to improve the reliability.

According to tile sixth feature of the invention, provided is a process for fabricating a light emitting diode comprises forming a convex mesa portion on the surface of a substrate; growing a sacrificial layer on the surface of the substrate which has the thickness not to exceed the height of said convex mesa portion; growing a plurality of epitaxial layers which form a light emitting portion on the substrate; and dissolving and removing the sacrificial layer to form a cavity layer between the surface of the substrate and the epitaxial layers except for the mesa portion.

According to the seventh feature of the invention, provided is a process for fabricating a light emitting diode comprises forming a convex mesa portion on the surface of a substrate; growing a sacrificial layer on the surface of the substrate which has the thickness to the extent of not exceeding the height of the convex mesa portion; melting back the surface of the substrate on which the sacrificial layer is grown and removing the convex mesa portion except for the sacrificial layer to form a concave mesa trace portion on the sacrificial layer; growing a plurality of epitaxial layers on the sacrificial layer which form a light emitting portion and has the thickness not to exceed the depth of the concave mesa trace portion to form a convex portion at the concave mesa trace portion; and dissolving and removing the sacrificial layer to form a cavity layer between the surface of the substrate and the epitaxial layers except for the convex portion formed at the concave mesa trace portion.

Here, "the thickness to the extent of not exceeding the height of the convex mesa portion" means that it may exceed a little the height of the mesa portion, in contrast with "the thickness not to exceed the height of the convex mesa portion".

According to the eighth feature of the invention, provided is a process for fabricating a light emitting diode according to the sixth or seventh feature of the invention wherein the substrate is GaAs, the epitaxial layers are GaAlAs, the sacrificial layer is GaAlAs which has higher ratio of AlAs mixed crystal than that of the GaAlAs epitaxial layers, and diluted solution which contains HF and $H_2O_2$ is used as the solution to dissolve the GaAlAs sacrificial layer which has high ratio of AlAs mixed crystal.

Meanwhile, the present invention may be applied to any light emitting diode having a structure in which the light to going the back surface is absorbed since the band-gap energy of a substrate is lower than that of epitaxial layers which form a light emitting portion.

In accordance with the first feature of the invention wherein the cavity layer is formed between the substrate and the epitaxial layers, most of the light going to the back surface through the epitaxial layers is reflected in the cavity layer and is released from the surface. Therefore, the light output efficiency can be enhanced by eliminating the necessity of forming the thick epitaxial layers which does not absorb light in place of the substrate and removing the substrate originally used, as done in the prior art. Moreover, the epitaxial layers which form the light emitting portion are partially connected with the substrate by the convex mesa portion which is formed on the surface of the substrate. Furthermore, as compared with the light emitting diode which does not have a cavity layer, the higher light emitting output can be obtained since the current is confined in the presence of the cavity layer.

In accordance with the second feature of the invention, the epitaxial layers which form the light emitting portion are partially connected with the substrate by means of the convex mesa portion which is formed on the back surface of the epitaxial layers, whereby the shape of the light emitting diode can be maintained like the first feature of the invention.

In accordance with the third feature of the invention, the epitaxial layers which form the light emitting portion are partially connected with the substrate by means of the convex mesa portion which is formed on the surface of the substrate and the convex portion which is formed on the back surface of the epitaxial layers, whereby the shape of the light emitting diode can be maintained like the first or second feature of the invention.

In accordance with the fourth feature of the invention according to any of the first to third feature of the invention wherein the substrate is GaAs and the epitaxial layers are GaAlAs, the higher brightness can be obtained.

In accordance with the fifth feature of the invention according to any of the first to fourth feature of the invention wherein resin is put in the cavity layer, the reliability can be enhanced.

In accordance with the sixth feature of the invention wherein the sacrificial layer which has the thickness not to exceed the height of the mesa portion is grown on the surface of the substrate, the epitaxial layers grows directly on the mesa portion and there is no sacrificial layer between the mesa portion and the epitaxial layers. Therefore, when the sacrificial layer is dissolved and removed thereafter, the epitaxial layers does not separate from the substrate and can be firmly connected with the substrate by the mesa portion. Furthermore, the formation of the cavity layer can be made easily since the cavity layer can be formed between the epitaxial layers and the surface of the substrate if only dissolving and removing the sacrificial layer.

In accordance with the seventh feature of the invention, the convex portion of epitaxial layers is connected with and formed in the concave portion of the substrate where the surface layer having disordered structure is removed by melting back. Therefore, the epitaxial layers can be more firmly connected since the connection between the substrate and the epitaxial layers is given by the melting back without being affected by the growth and etching conditions of the sacrificial layer. Furthermore, the formation of the cavity layer can be made easily like the sixth feature of the invention since the cavity layer can be formed by between only dissolving and removing the sacrificial layer.

In accordance with the eighth feature of the invention according to the sixth or seventh invention wherein the substrate is GaAs, the epitaxial layers are GaAlAs, the said sacrificial layer is GaAlAs which has higher ratio of AlAs mixed crystal than that of said GaAlAs epitaxial layers, and diluted solution which contains HF and $H_2O_2$ is used as the solution to dissolve the GaAlAs sacrificial layers which has high ratio of AlAs mixed crystal, melting-back, dissolution and removal of the sacrificial layer can be surely performed and the formation of the cavity layer can be made more surely and easily.

The embodiments to which the invention is applied will be described below by referring to the attached drawings.

BRIEF DESCRIPTION OF THE DRAWINGS

FIGS. 6A to 6C are cross-sectional views for illustrating a process for fabricating the light emitting diode in the second growing embodiment.

DESCRIPTION OF THE PREFERRED EMBODIMENTS

FIRST PREFERRED EMBODIMENT

Figure 1:
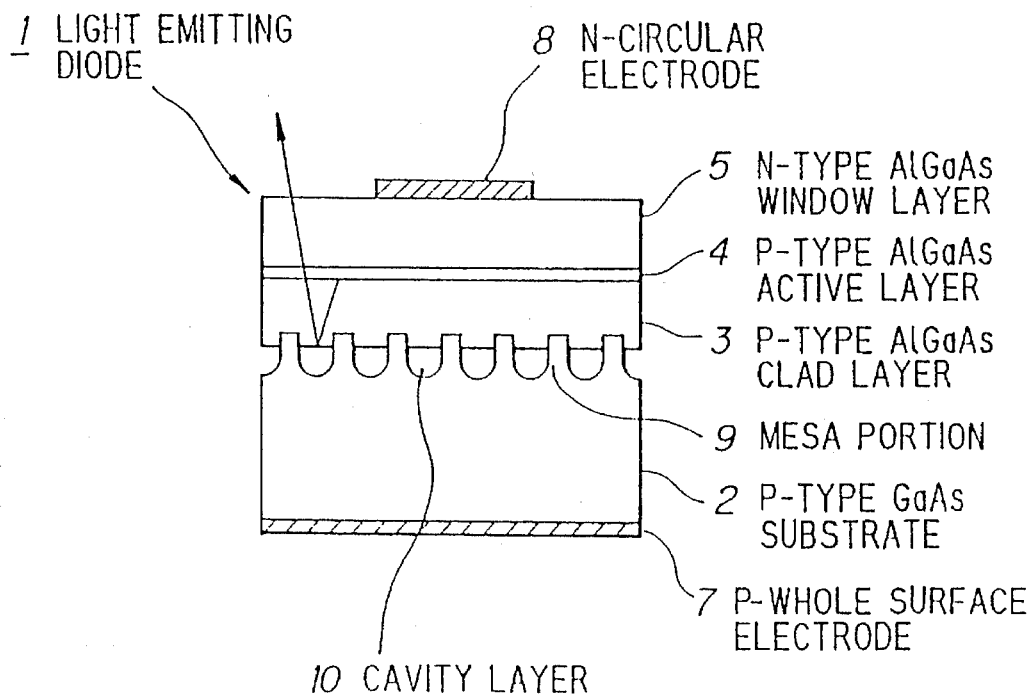
FIG. 1 is a cross-sectional view for illustrating a light emitting diode in the first preferred embodiment according to the invention.

The infrared light emitting diode 1 according to the invention, as shown in FIG. 1, is an improvement of the conventional light emitting diode structure in which the light going to the back surface is absorbed in the substrate since the band-gap energy of a substrate is lower than that of epitaxial layers which form a light emitting portion, and it has a structure in which the light going to the back surface is reflected and taken out of the surface side.

The light emitting diode 1 has a DH (double-hetero) structure in which a P-type AlGaAs clad layer 3, a P-type AlGaAs active layer 4 and a N-type AlGaAs window layer 5 are formed on a P-type GaAs substrate 2. There are formed a P-type whole electrode 7 on the side of the P-type GaAs substrate 2, and a N-type circular electrode 8 on the side of the N-type AlGaAs window layer 5, respectively.

There is formed a convex mesa portion 9 on the surface of the P-type GaAs substrate 2. The clad layer 3 is connected with the mesa portion 9 in the form that the upper portion of the mesa portion 9 is inserted into the clad layer 3. This connection is partially made, thereby a cavity layer 10 is obtained between the P-type GaAs substrate 2 and the P-type AlGaAs clad layer 3.

In operation, the light generated at the P-type AlGaAs active layer 4 propagates through the N-type AlGaAs window layer 5 and the P-type AlGaAs clad layer 3, and the light going to the back surface of the P-type AlGaAs clad layer 3 is reflected on the interface between the clad layer 3 and the cavity layer 10, so that it goes back to the N-type AlGaAs window layer 5. Consequently, the light generated at the P-type AlGaAs active layer 4 can be taken out in high efficiency from the surface of the chip of the light emitting diode 1.

The reason why it is reflected on the interface of the cavity layer 10 is that the refractive index of the cavity layer 10 is so small as 1.0 or around 1.5 when resin is put whereas the refractive index of the P-clad layer 3 is around 3.5, therefore the light is likely to be reflected on the interface. When the chip is molded with resin, there are two cases where the cavity layer is vacant and the resin is entered thereinto, in both cases the light is reflected on the interface between the cavity layer and the P-type clad layer. Because of this, even if the GaAs substrate 2 is existed, the light emitting diode which has high reflection effect can be made.

On the other hand, according to the light emitting diode in this preferred embodiment, the current is constricted due to the cavity layer, thereby internal quantum efficiency becomes higher and more than two times of light emitting output or light emission can be obtained, as compared with the conventional DH structure light emitting diode which does not have a cavity layer. Furthermore, the response rate becomes two times as fast as the prior art in accordance with the higher current density.

Next, a process for fabricating the light emitting diode which has the structure as mentioned above will be described below.

At first, the P-type GaAs substrate 2 is prepared. For instance, this is a GaAs substrate which is doped by zinc which has carrier concentration of $1\times 10^{19}$ cm$^{-3}$ to $3\times10^{19}$ cm$^{-3}$. On the surface of the GaAs substrate, there is formed the convex mesa portion 9 by means of the photolithography and dry or wet etching method. The mesa portion 9 is approximately in the form of column of 10 micrometers in diameter and 5 micrometers in height. It is disposed like a matrix at intervals of 40 micrometers.

Figure 2:
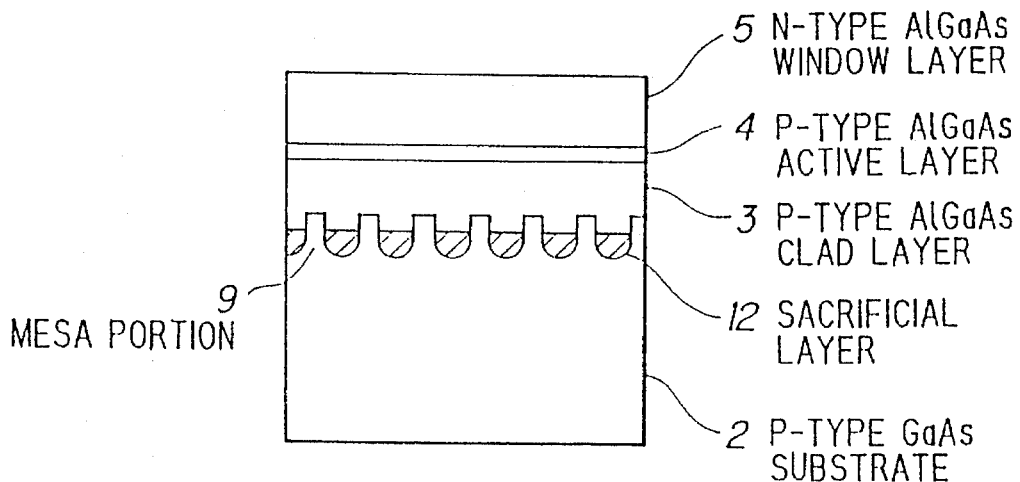
FIG. 2 is a cross-sectional view for illustrating the state of growth of four epitaxial layers including a sacrificial layer on a substrate in the first preferred embodiment.

On the surface of the P-type GaAs substrate 2 which is formed with the convex mesa portion 9, as shown in FIG. 2, four epitaxial layers are grown by the liquid phase epitaxial method. That is, a sacrificial layer 12 is formed in addition to the clad layer 3, the active layer 4 and the window layer 5.

The sacrificial layer 12 is made from AlGaAs of high mixed crystal which has the AlAs mixed crystal ratio of 0.90 and is designed to have the thickness of around 2 micrometers not to exceed the height of the mesa portion 9. The sacrificial layer 12 of high mixed crystal does not grow on the top of the mesa portion 9 at the step in which the growth solution with low super-saturation is contacted with the substrate 2. The P-type AlGaAs clad layer 3 is designed to have the AlAs mixed crystal ratio of 0.25 and the thickness of around 30 micrometers. The P-type AlGaAs active layer 4 is designed to have the AlAs mixed crystal ratio of 0.05 and the thickness of around 1 micrometer. Further, the N-type AlGaAs window layer 5 is designed to have the AlAs mixed crystal ratio of 0.25 and the thickness of around 30 micrometers. Meanwhile, the refractive index of the AlAs mixed crystal ratio of 0.25 is around 3.5. After the electrode 7 and 8 is formed on the back and front surfaces of the epitaxial wafer grown as above structure, respectively, grooves of 80 micrometers in depth are formed to divide the wafer into each chip. Thereafter, when the wafer is dipped into the etching liquid, the sacrificial layer 12 is removed to form the cavity layer 10. In detail, the epitaxial layer is dipped into the diluted solution of HF and $H_2O_2$, so that the sacrificial layer is dissolved and removed. That is, only the sacrificial layer 12 which is made from AlGaAs of high mixed crystal ratio is dissolved by this solution.

Thereafter, the epitaxial wafer is divided to provide the chip of the light emitting diode by dicing. Each of the divided light emitting diodes is mounted on the stem, being wired by wire bonding, and being molded by resin, so that the device of the light emitting diode is obtained. The epoxy resin which has in general the refractive index of around 1.5 is used for molding. It is preferable to use the resin of the higher refractive index in order to enhance the efficiency in the light output.

When the characteristics of an infrared light emitting diode which has the structure mentioned above are evaluated, the results are as follows.

The light emitting diode in the preferred embodiment of the invention can provide high light output in that the light emitting output is 20±1 mW in the forward direction current of 50 mA, whereas in the conventional light emitting diode with the DH structure the light emitting output is 8.0±1 mW in the forward direction current of 50 mA.

Further, it is confirmed that the light emitting output is 7.0±0.9 mW in the state of a non resin-molded, bare chip in the preferred embodiment, while the light emitting output is 2.5±0.3 mW in the state of a non resin-molded bare chip in the conventional light emitting diode.

In particular, when the light emitting diode is made as the infrared light emitting diode of AlGaAs, it can provide high light output in that the light emission is 2500 mcd in the forward direction current of 20 mA.

In the light emitting diode in the preferred embodiment of the invention, it is found that the dispersion in the light emitting output is highly decreased whereas the dispersion is in general increased when the conventional light emitting diode of a back surface reflection type is made.

Furthermore, in the preferred embodiment an AlGaAs thick film of high mixed crystal ratio is not require to be grown, through it is needed as a substrate for the conventional light emitting diode of a back surface reflection type. That is, since the GaAs substrate remains as a substrate. Therefore, the thickness of the AlGaAs layer grown on the substrate is not needed to be more than a thickness inherent to the layer, so that the condition in temperature becomes relieved, the epitaxial layer becomes easy to grow and the uniformity of the characteristics can be improved. Meanwhile, the AlGaAs layer of high mixed crystal does not affect the characteristics since it is grown as a thin sacrificial layer and is removed thereafter.

Furthermore, since it only requires to grow the four epitaxial layers by expanding the growth system of the epitaxial wafer in the conventional DH structure, removing of the GaAs substrate is not necessary, so that it can use the conventional mass production technique as it is.

Accordingly, it is possible to easily grow the epitaxial wafer which is significantly low in cost, high light output and properties with excellent uniformity.

Meanwhile, when the light emitting diode 1 is molded by resin, the cavity layer 10 may be held as it is or may be filled with of the resin for molding. Even if the resin is put in it, the light can be reflected on the interface between the clad layer 3 and the resin as long as the refractive index of the resin is smaller than that of the P-type AlGaAs clad layer 3.

Though the above preferred embodiment is concerned with the light emitting diode in double hetero-structure, the invention may also be applied for the single hetero-structure, and the substrate and the conduction type may be entirely reversed in the above preferred embodiment.

As described above, when the light emitting diode in the first preferred embodiment is made, the sacrificial layer 12 which is the AlGaAs layer of high mixed crystal is grown on the substrate not to exceed the height of the mesa portion 9 as shown in FIG. 2. However, if the growth condition is changed to some extent, the thin film of the AlGaAs sacrificial layer may also grow on the mesa portion. In this case, the light emitting diode with a structure as shown in FIG. 3 is obtained.

Figure 3:
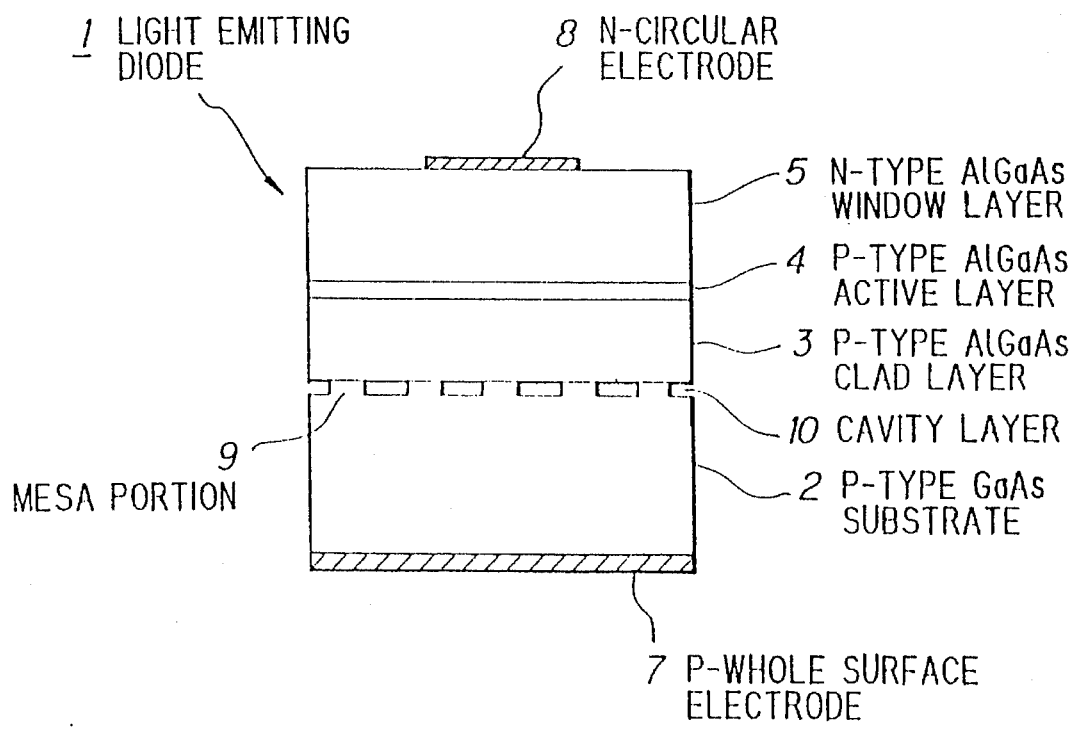
FIG. 3 is a cross-sectional view for illustrating an infrared light emitting diode as an alteration for the first preferred embodiment.

As shown in the cross-sectional structure in FIG. 3, the light emitting diode with the structure in which the flat bottom surface of the clad layer 3 is positioned just on the mesa portion 9 without being inserted thereinto is obtained.

When the DH structure light emitting diode as shown by this structure is evaluated, the light emitting output is 18±1 mW in the forward direction current of 50 mA. On the other hand, the light emitting output of a non resin-molded, bare chip is 6±0.8 mW in the preferred embodiment. It is found that the value is higher than the conventional one though it is lower than that of the light emitting diode with the structure as shown in FIG. 1.

On the other hand, in the above mentioned connection structure in which the substrate and the epitaxial layers are partially connected by the mesa portion, if the AlGaAs sacrificial layer grows on the mesa portion, the epitaxial layers 3, 4 and 5 which form the light emitting potion have a low possibility in which the layers may be peeled from the substrate 2 when the sacrificial layer is etched.

Even if the etching is well performed, the peeling may occur due to the stress applied on the interface between the substrate and the epitaxial layers or the longtime operation, temperature change and the like when the light emitting diode molded by resin is made. The following second preferred embodiment can give solution to such problem.

SECOND PREFERRED EMBODIMENT

Figure 4:
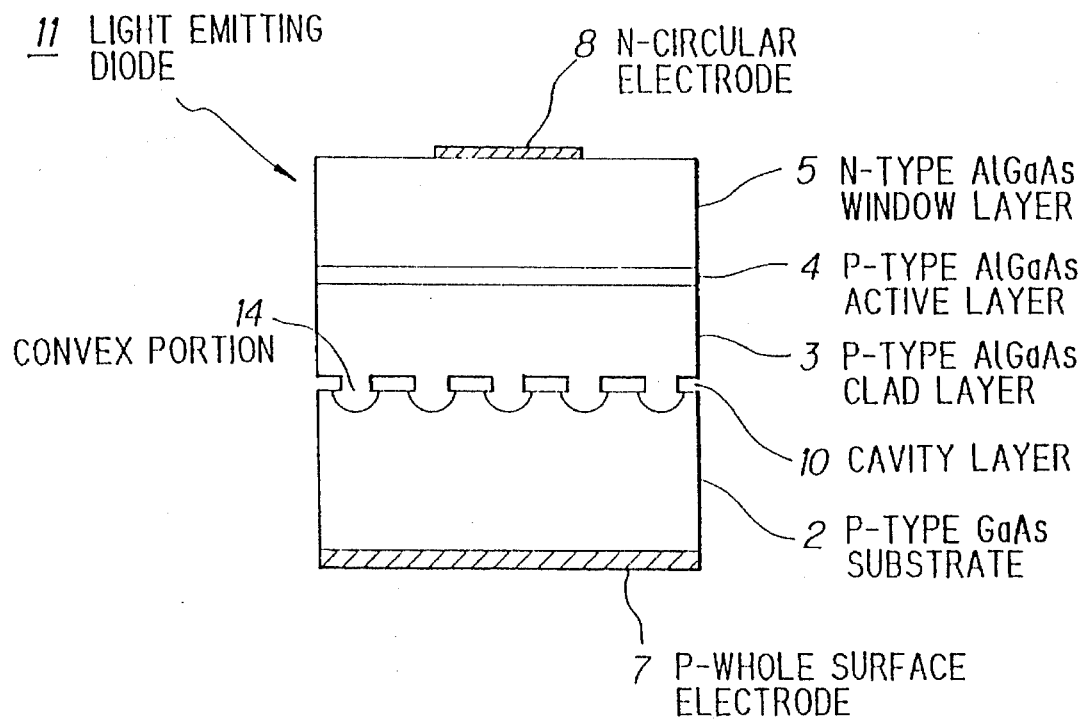
FIG. 4 is a cross-sectional view for illustrating the state of growth of four epitaxial layers including a sacrificial layer on a substrate in the second preferred embodiment.

As shown in FIG. 4, a light emitting diode in the preferred embodiment is a modification of the connection structure in which a substrate and epitaxial layers are partially connected by a convex portion of the epitaxial layers, wherein like parts are indicated by like reference numerals as used in the first preferred embodiment.

The light emitting diode 11 is different from the light emitting diode 1 in the first preferred embodiment in that there is formed the convex portion 14 on the back surface of the P-type AlGaAs clad layer 3 and the clad layer 3 is directly connected with the P-type GaAs substrate 2 by the convex portion 14. The convex portion 14 has an enlarged diameter portion to be explained later, and the enlarged diameter portion is connected with the substrate 2, so that in comparison with the first preferred embodiment the connection area is larger and the connection strength is higher.

Next, a process for fabricating the infrared light emitting diode with this structure will be described below in accordance with FIGS. 5 and 6.

Figure 5A:
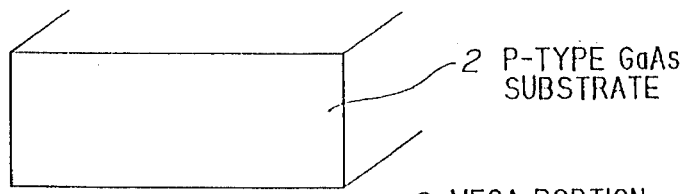
FIGS. 5A to 5E are cross-sectional views for illustrating a process for growing epitaxial layers in an infrared light emitting diode in the second layers embodiment.
Figure 5B:
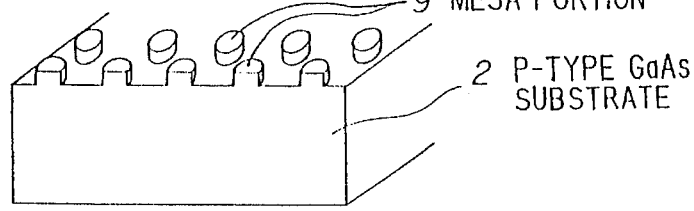

At first, the P-type GaAs substrate 2 is prepared as shown in FIG. 5A. For instance, this is a GaAs substrate which is doped by zinc which has carrier concentration of $1\times10^{19}$ $cm^{-3}$ to $3\times10^{19}$ $cm^{-3}$. On the surface of the GaAs substrate 2, there is formed the convex mesa portion 9 by means of the photolithography and etching method. The mesa portion 9 is in the form of column of 10 micrometers in diameter and 3 micrometers in height. It is disposed like a matrix at intervals of 40 micrometers as shown in FIG. 5B.

Figure 5C:
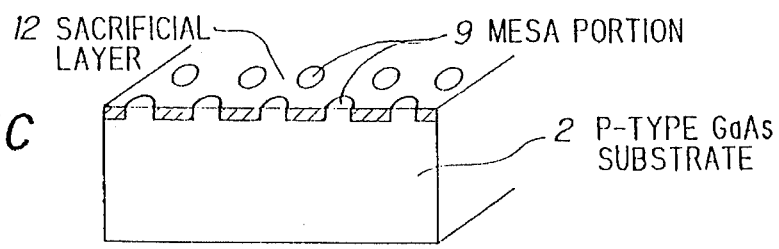

On the P-type GaAs substrate 2 which is formed with the convex mesa portion 9, an epitaxial layer 12 for a sacrificial layer is grown as shown in FIG. 5C.

The AlGaAs layer of the sacrificial layer 12 which is formed on the GaAs substrate 2 has the AlAs mixed crystal ratio of 0.90 and the thickness of around 2 micrometers. Due to the liquid phase epitaxial method, the sacrificial layer 12 is grown only in interstices of the mesa portion 9. This is well known in the art as the liquid phase epitaxial growth. However, due to the dispersion of growth, it may be grown like thin film on the mesa portion 9.

Figure 5D:
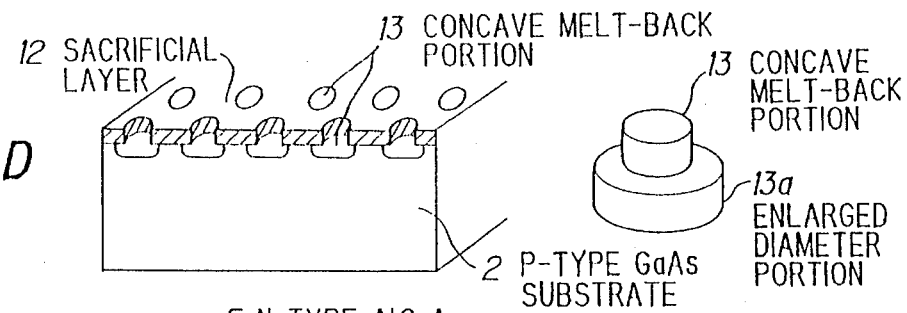

Thereafter, the P-type AlGaAs clad layer 3 is grown. At this time, the growth solution is made unsaturated by lessening the amount of GaAs which is added to the growth solution for the clad layer. Though, in the first preferred embodiment, the AlGaAs sacrificial layer 12 of high mixed crystal employs the growth solution with low supersaturation, the unsaturated growth solution is employed here. By contacting the unsaturated growth solution with the substrate 2, the surface of the substrate 2 is melted back to remove the convex mesa portion 9. Due to this removal, the concave melt-back portion 13 which is the trace of the mesa portion is formed in the sacrificial layer 12 as shown in FIG. 5D.

The growth solution mentioned above is comprised of Ga metal, Al metal, GaAs polycrystal and Zn dopant. If the amount of GaAs addition is too much, melting-back is not obtained. If it is too little, the amount of melting-back, becomes too much. For this reason, the amount of GaAs addition is controlled, such that the amount of melting-back can be 4 micrometers deep as a set point from the top of the mesa potion 9, and the dispersion can be around 0.1 to 10 micrometers. The unsaturated solution can highly dissolve the surface of the GaAs substrate 2 substantially without etching the sacrificial layer 12. Accordingly, the melt-back portion is deeply hollowed out, so that the concave portion 13 is provided with an enlarged diameter portion 13a as shown by an enlarged view at the right hand of FIG. 5D.

This is caused by the rate of melting-back which highly depends on the AlAs mixed crystal ratio in the material which is dissolved. Interestingly, even if dissolution is made downward whole of the sacrificial layer 12, there can be formed such structure that the sacrificial layer 12 is embedded into the clad layer 3 after growing the epitaxial layer since the sacrificial layer is in the form of a matrix.

Meanwhile, the sacrificial layer 12 which may grow like thin film on the mesa portion can be entirely removed by melting back as mentioned above. Therefore, the thickness of the sacrificial layer 12 may exceed the height of the mesa portion 9.

Figure 5E:
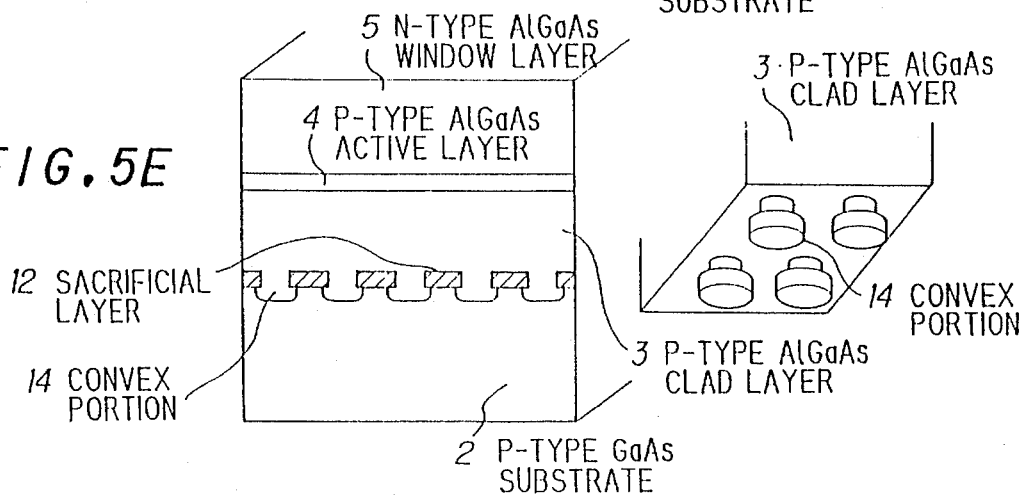

After melting back, the growth of clad layer 3 is continued to be followed by growing the P-type AlGaAs active layer 4 and N-type AlGaAs window layer 5 as shown in FIG. 5E.

In accordance with the growing of the clad layer 3 after melting back, a convex portion 14 which corresponds to the concave melt-back portion 13 is formed on the back surface of the clad layer 3, as shown by an enlarged view at the right hand of FIG. 5E. By the convex portion 14, the clad layer 13 is directly and partially connected with the substrate 2.

The P-type AlGaAs clad layer 3 has AlAs mixed crystal ratio of around 0.25 and the thickness of around 30 micrometers. The P-type active layer 4 has AlAs mixed crystal ratio of around 0.05 and the thickness of around 1 micrometer. The N-type AlGaAs window layer 5 has AlAs mixed crystal ratio of around 0.30 and the thickness of around 30 micrometers.

Thereafter, as shown in FIG. 6A, the N circular electrode 8 and the P whole electrode 7 are formed on the top and back surfaces of the epitaxial wafer, respectively.

After the formation of the electrodes, grooves for dividing into chips are formed. The grooves are disposed like a matrix at intervals of 300 micrometers, having width of 40 micrometers and depth of 80 micrometers. The epitaxial wafer is dipped into the diluted solution of HF and $H_2O_2$, so that the sacrificial layer 12 is dissolved and removed. By the dissolving and removing the sacrificial layer, as shown in FIG. 6B, the cavity layer 10 is formed between the substrate 2 and the clad layer 3, except for the convex portion 14 on the back surface of the clad layer 3. Thus, chips each having an area of 300 μm×300 μm are obtained.

At this etching step, only the AlGaAs sacrificial layer 12 of high mixed crystal can be etched, and the other AlGaAs layers 3, 4 and 5 can be hardly etched.

In the epitaxial wafer thus formed, as shown in FIG. 6C, the light is reflected at the interface between the clad layer 3 and the cavity layer 10, so that most of the generated light goes to the N-type window layer 5.

In the second preferred embodiment, even if the growth condition is changed to some extent, and, therefore, a thin film of the AlGaAs sacrificial layer grows on the mesa portion, there is no problem, since the mesa portion in itself is removed by melting back. Furthermore, since the convex portion on the back face of the clad layer is firmly connected with the surface of the substrate which is cleaned by melting back, the connection becomes so rigid. Therefore, when the sacrificial layer is etched at the time of making chips, the DH structure epitaxial layers which form the light emitting portion is not peeled out from the substrate, and it is not peeled out, even if the stress is applied on the interface between the substrate and the epitaxial layer. Further, the device has stability against long time operation, temperature change and the like after the production of the light emitting diode molded with resin.

Further, the epitaxial wafer is divided to obtain the chip of the infrared light emitting diode by dicing. Each of the divided light emitting diode is mounted on the stem, being wired by wire bonding, and being molded by resin, so that a device of the light emitting diode is obtained.

When the characteristics of this light emitting diode are evaluated, higher light output than in the first preferred embodiment is obtained, wherein that the light emitting output is 22.0±2.0 mW in the forward direction current of 50 mA, and is 10.0±1 mW in the state of a non resin-molded, bare chip. Further, it is found that the dispersion in the light emitting output in this preferred embodiment is highly decreased whereas the dispersion is in general increased when the conventional light emitting diode of a back surface reflection type is made.

Though the probability of peeling out of the DH structure epitaxial layer, when the sacrificial layer is etched at the time of making chips, is around 30% in the first preferred embodiment, it can be less than 1% in this preferred embodiment where the DH structure epitaxial layer is grown after the melting back.

Furthermore, though there are found around 20% of fabricated chips in the first preferred embodiment in which the flowing current is limited to around 10 mA, it can significantly be less than 1% in this preferred embodiment.

According to this preferred embodiment, the life of the device with resin molding can significantly be improved. 100 chips are given to the test method where the current of 100 mA is flown 1000 cycles in the range of room temperature to −40° C., resulting in that there is no chip in which the flowing of current becomes impossible.

Further, when this preferred embodiment for the infrared light emitting diode is applied to an AlGaAs red light emitting diode, it is found that high light-emitting output is obtained, in which the light emission the top surface is 2500 mcd(light emitting output of 6.0 mW) in the forward direction current of 20 mA.

Meanwhile, though whole of the convex mesa portion is removed by melting back in the second preferred embodiment, only the top part of the mesa portion may be removed to form such a structure of the light emitting diode as in the first preferred embodiment. For this structure, the sacrificial layer which may grow on the top of the mesa portion can effectively be removed, so that the reliability of connection is improved in comparison with the first preferred embodiment.

Furthermore, the combination of the first and second preferred embodiments may be employed by forming the convex mesa portion on the surface of the substrate and the convex portion on the back surface of the epitaxial layer, respectively, wherein the mesa portion and the convex portion partially connect the epitaxial layer with the substrate, so that a cavity layer is formed between the substrate and the epitaxial layer except for the mesa portion and the convex portion. In the preferred embodiment, the solution of HF and $H_2O_2$ is used. However, diluted water solution of HF and $H_2O$ in the ratio of 1:10 may be used to remove the sacrificial layer.

The advantages of the invention will be explained below.

1. In accordance with the invention, the partial connection between the substrate and the epitaxial layer is obtained by the mesa portion on the surface of the substrate and the cavity layer is formed between the epitaxial layer and the substrate to reflect the light at the cavity layer. As a result, the light-emitting output can significantly be improved.
2. In accordance with the invention, the partial connection between the substrate and the epitaxial layer is obtained by the convex portion on the back surface of the epitaxial layer, and the cavity layer is formed to reflect the light at the cavity layer between the epitaxial layer and the substrate. Consequently, the light-emitting output can significantly be improved.
3. In accordance with the invention, the partial connection between the substrate and the epitaxial layer is obtained by the mesa portion on the surface of the substrate and the convex portion and the cavity layer is formed to reflect the light at the cavity layer between the epitaxial layer and the substrate. Consequently, the light-emitting output can significantly be improved.
4. In accordance with the invention, GaAs/GaAlAs compound semiconductor with high brightness is employed as a material of the light emitting diode. Consequently, the light-emitting output can significantly be improved. Furthermore, the uniformity of the characteristics can be improved, since the growth of the thick film AlGaAs layer with high AlAs mixed crystal ratio is not required.
5. In accordance with the invention, resin is put in the cavity layer. Consequently, the reliability can significantly be improved.
6. In accordance with the invention, the sacrificial layer which has the thickness not to exceed the height of the mesa portion is grown on the surface of the substrate. Consequently, the epitaxial layer can firmly be connected with the substrate by the mesa portion. Furthermore, the cavity layer can easily be formed simply by dissolving and removing the sacrificial layer.
7. In accordance with the invention, the convex portion is formed of the epitaxial layer, and the connection with the substrate is obtained by the convex portion. Consequently, the epitaxial layer can more firmly be connected. Furthermore, the cavity layer can easily be formed simply by dissolving and removing the sacrificial layer.
8. In accordance with the invention, a GaAs/GaAlAs compound semiconductor with high brightness is employed as a material of the light emitting diode and the sacrificial layer is made of high mixed crystal GaAlAs compound semiconductor and $HF/H_2O_2$ etching solution suitable for dissolving and removing the sacrificial layer is employed. Consequently, the removal of the sacrificial layer can surely be made, and the cavity layer can more surely and easily be formed. Furthermore, since the growth of the thick film AlGaAs layer with high AlAs mixed crystal ratio is not required. Consequently, the fabrication is made easy, and the light emitting diode which has high yield at the time of fabricating as well as high reliability can be fabricated while retaining the high brightness characteristic.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A light emitting diode which is formed with a plurality of epitaxial layers defining a light emitting portion on a substrate, comprising: a column-shaped mesa portion providing cavities on a surface of said substrate, said epitaxial layers being partially connected with said substrate by said column-shaped mesa portion; and a cavity layer formed between said substrate and said epitaxial layers at said cavities except for said column-shaped mesa portion, said cavity layer reflecting light emitted from said light emitting portion to said substrate to propagate light in a direction away from said substrate.

2. A light emitting diode, according to claim 1, wherein said substrate is GaAs, and said epitaxial layers are GaAlAs.

3. A light emitting diode, according to claim 1 wherein resin is put into said cavity layer.

4. A light emitting diode which is formed with a plurality of epitaxial layers defining a light emitting portion on a substrate, comprising: an outwardly protruding portion on a back surface of said epitaxial layers, said epitaxial layers being partially connected with said substrate by said outwardly protruding portion; and a cavity layer formed between said substrate and said epitaxial layers except for said outwardly protruding portion, said cavity layer reflecting light emitted from said light emitting portion to said substrate to propagate light in a direction away from said substrate.

5. A light emitting diode, according to claim 4, wherein said substrate is GaAs, and said epitaxial layers are GaAls.

6. A light emitting diode, according to claim 4, wherein resin is put into said cavity layer.

7. A light emitting diode which is formed with a plurality of epitaxial layers defining a light emitting portion on a substrate, comprising: a column-shaped mesa portion on a surface of said substrate; an outwardly protruding portion on a back surface of said epitaxial layers; said eptiaxial layers being partially connected with said substrate by said column-shaped mesa portion and said outwardly protruding portion; and a cavity layer formed between said substrate and said epitaxial layers except for said column-shaped mesa portion and said outwardly protruding portion, said cavity layer reflecting light emitted from said light emitting portion to said substrate to propagate light in a direction away from said substrate.

8. A light emitting diode, according to claim 7, wherein said substrate is GaAs, and said epitaxial layers are GaAls.

9. A light emitting diode, according to claim 7, wherein resin is put into said cavity layer.

10. A light emitting diode, comprising:

a semiconductor substrate of a first conductivity type;

a clad layer grown on a top surface of said semiconductor substrate, said clad layer being of said first conductivity type;

an active layer grown on said clad layer, said active layer being of said first conductivity type;

a window layer grown on said active layer, said window layer being of a second conductivity type;

a first electrode provided on a back surface of said semiconductor substrate, said back surface being opposite to said top surface; and a second electrode provided on a top surface of said window layer, said top surface of said window layer being opposite to a back surface facing said active layer;

wherein a plurality of cavities are provided at an interface between said semiconductor substrate and said clad layer, said interface reflecting light emitted by said active layer to said substrate to propagate light in a direction away from said substrate.

11. A light emitting diode, according to claim 10, wherein each of said plurality of cavities is semicircular.

12. A light emitting diode, according to claim 10, wherein each of said plurality of cavities is rectangular.

* * * * *